(12) United States Patent
Janczek et al.

(10) Patent No.: US 6,186,008 B1
(45) Date of Patent: Feb. 13, 2001

(54) SEMICONDUCTOR SENSOR COMPONENT

(75) Inventors: Thies Janczek, Flintbek; Bernd Stadler, Donaustauf; Detlef Houdeau, Langquaid, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/349,551

(22) Filed: Jul. 8, 1999

Related U.S. Application Data

(63) Continuation of application No. PCT/DE97/02845, filed on Dec. 5, 1997.

(30) Foreign Application Priority Data

Jan. 8, 1997 (DE) .............................................. 197 00 393

(51) Int. Cl.⁷ ................................ G01L 9/00; G01L 9/16
(52) U.S. Cl. ............................................................ 73/754
(58) Field of Search ............................ 73/706, 715, 716, 73/717, 719, 720, 721, 722, 723, 726, 727, 754, 756; 257/415, 417, 419, 420, 687, 701

(56) References Cited

U.S. PATENT DOCUMENTS

| 4,732,042 | 3/1988 | Adams . |
| 4,914,954 | 4/1990 | Zlamal . |
| 5,436,491 | 7/1995 | Hase et al. . |

FOREIGN PATENT DOCUMENTS

| 4133061A1 | 4/1993 | (DE) . |
| 4436485A1 | 4/1995 | (DE) . |
| 4413274A1 | 10/1995 | (DE) . |
| 0286867A1 | 10/1988 | (EP) . |

OTHER PUBLICATIONS

"MOS Integrated Silicon Pressure Sensor", Hiroshi Tanigawa et al., IEEE Transactions on Electron Devices, vol. ED–32, No. 7, Jul. 1985.

"Integrierbare Funktionsblöcke und Systeme", E. Habekotte et al., Elektronik, 1990, pp. 80–87 (No mo).

"Anwendungsspezifische intelligente Sensoren ("ASIS")", H.A. Kayal et al., Elektronik, 1988, pp. 112–117 (No mo.).

*Primary Examiner*—William Oen
(74) *Attorney, Agent, or Firm*—Herbert L. Lerner; Laurence A. Greenberg; Werner H. Stemer

(57) ABSTRACT

A housing for a semiconductor sensor configuration, in which a sensor and an evaluation logic are integrated in a semiconductor body is disclosed. The housing has a base body upon which the semiconductor body is applied and a cover that encloses the semiconductor body in the base body. The cover is directly set on the base body of the housing and contains a membrane and/or labyrinth.

16 Claims, 5 Drawing Sheets

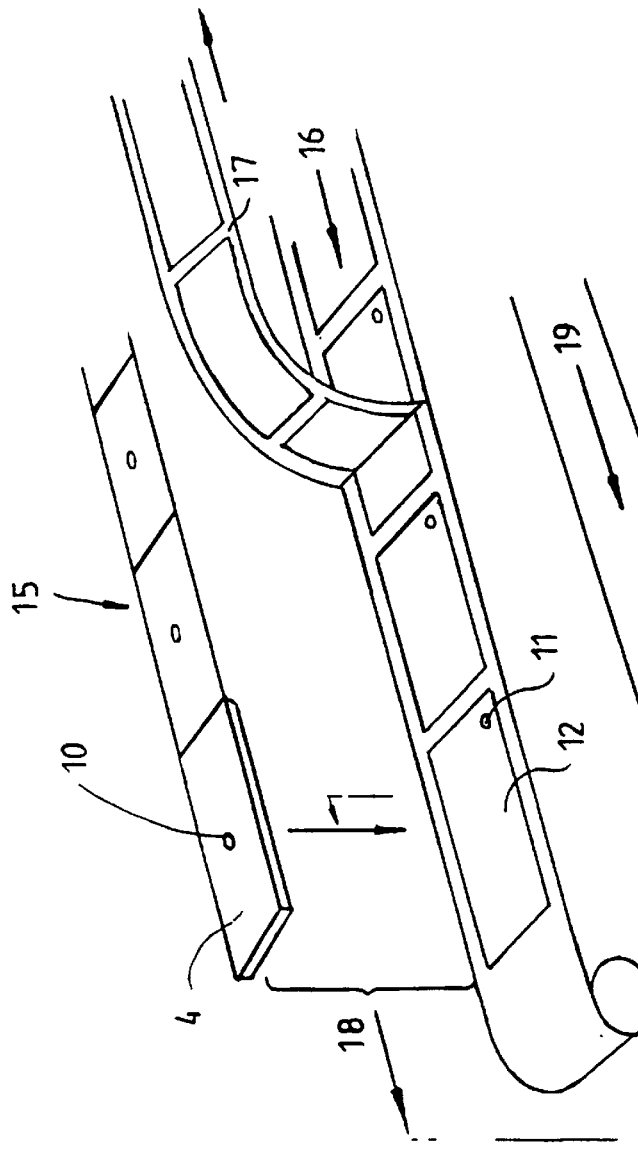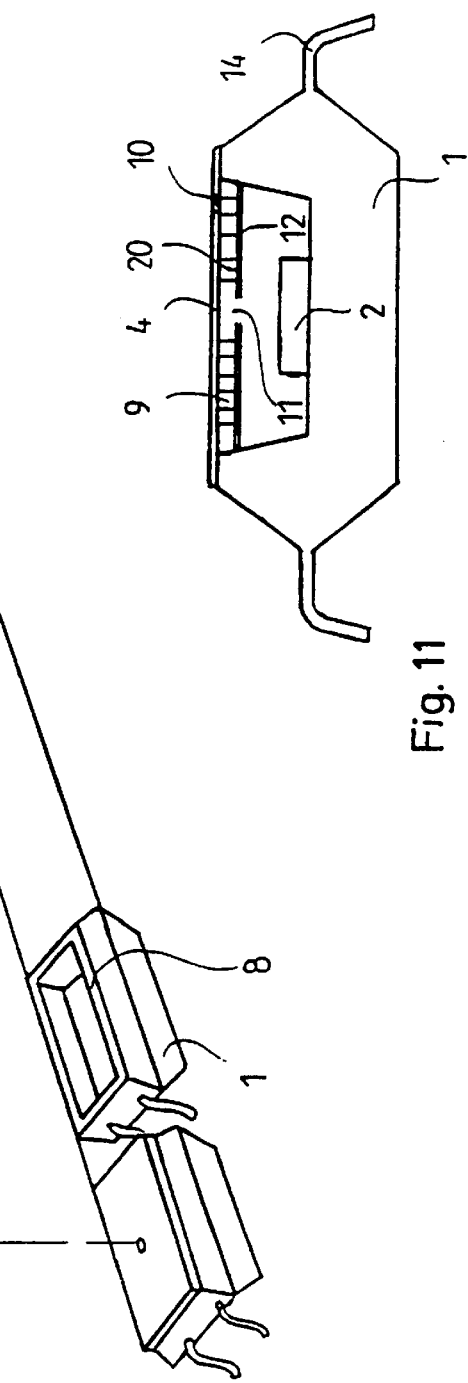
Fig. 10
Fig. 11

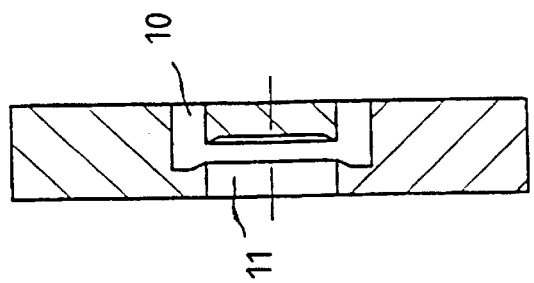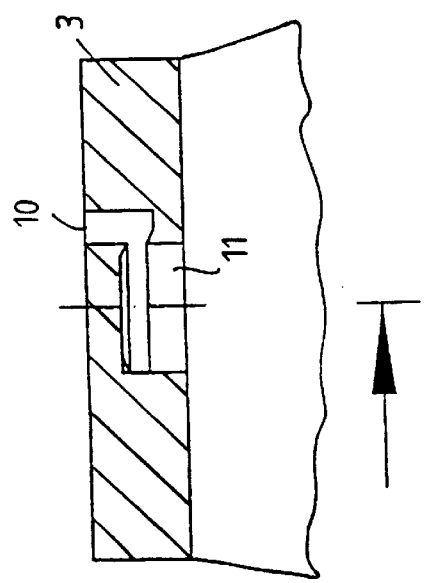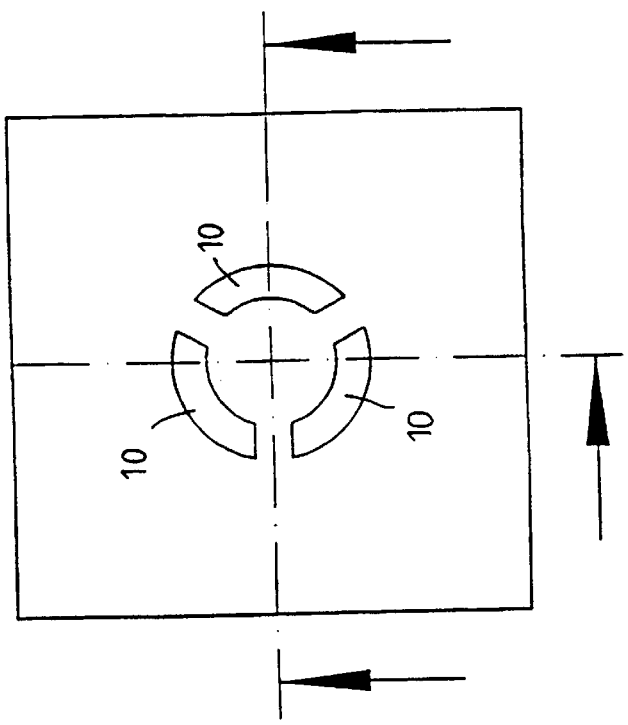

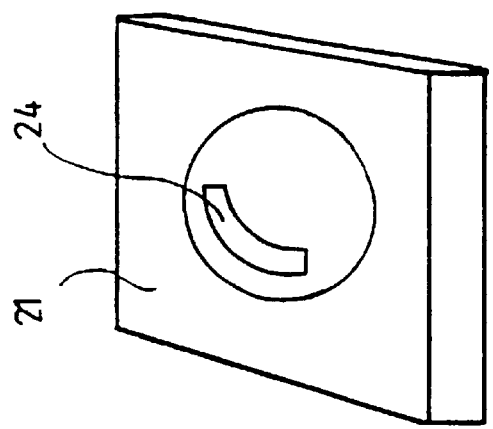
Fig. 17
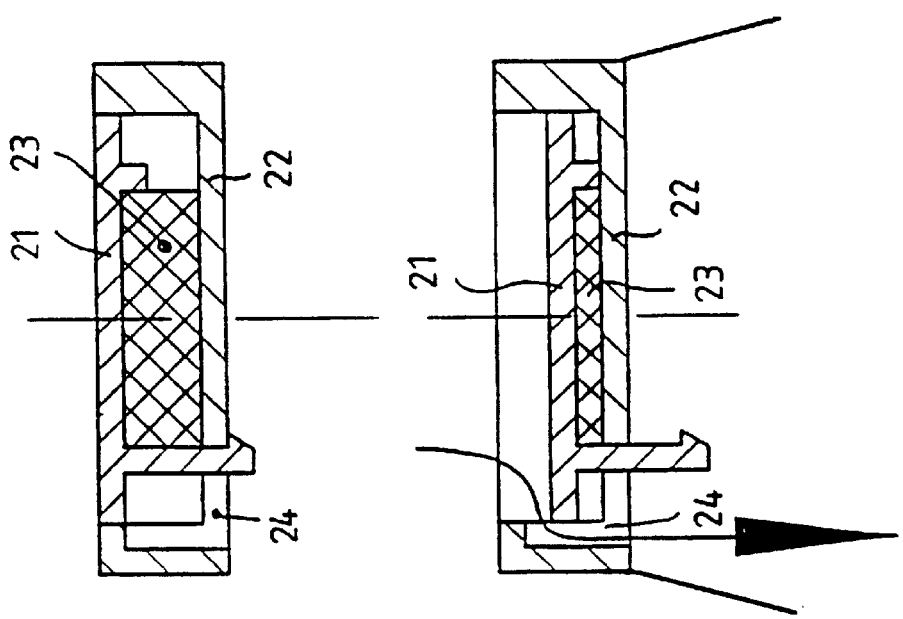
Fig. 15
Fig. 16

SEMICONDUCTOR SENSOR COMPONENT

CROSS-REFERENCE TO RELATED APPLICATION

This is a continuation of copending International Application PCT/DE97/02845, filed Dec. 5, 1997, which designated the United States.

BACKGROUND OF THE INVENTION

Field of the Invention

The invention concerns a semiconductor sensor component with a semiconductor body in which both a sensor and an evaluation circuit are formed in an integrated manner and are protected by an encapsulation.

It is known that semiconductor sensors must be protected against the effects of process and environment. At the same time, it is necessary that the semiconductor sensor remains accessible for the medium to be measured. For example, the configuration for the semiconductor pressure sensor must allow the actual semiconductor pressure sensor to be coupled to the pressure to be measured. In other words, a changing pressure must be able to exert an effect on the surface of the semiconductor sensor. The same applies, for example, for temperature sensors, humidity sensors, etc. In this connection care must be taken that the protective case of the semiconductor sensor introduces the minimum possible delay in performing the measurement.

In an existing semiconductor pressure sensor configuration the semiconductor body of the actual semiconductor sensor is accommodated on a circuit board in an inner case equipped with a membrane, which case is provided together with an evaluation logic circuit in an outer case. Access of the measuring medium, i.e. mostly air or gas, to the inner case proceeds over a silicone membrane of the outer case. A construction of this kind leads inevitably to relatively large modules since the semiconductor sensor and the evaluation logic circuit are provided in different semiconductor bodies.

Semiconductor sensor configurations in which the actual semiconductor sensor and the evaluation logic circuit are combined in a single semiconductor body must be accommodated in a case that is open on one side. Up to now, after a semiconductor body of this kind has been bonded in the case open on one side, the semiconductor body is covered with silicone gel or a similar material and embedded. It has been found, however, that this kind of covering material does not provide adequate mechanical protection for the semiconductor body and that, also, its surface is adhesive to a certain extent that is a hindrance in practical applications. Further disadvantages are the danger that mechanical influences might destroy the semiconductor body and the effect of particles that settle on the surface of the semiconductor sensor configuration and can influence the characteristic curve of the sensor.

U.S. Pat. No. 4,732,042, for example, describes a semiconductor pressure sensor configuration in which the semiconductor is embedded in silicone rubber inside a case which is provided with a membrane on one side. In this semiconductor sensor configuration the underside of the semiconductor body is freely accessible through a hole in the case so that here there exists the danger of mechanical damage. This semiconductor sensor configuration also has no evaluation electronics integrated in the semiconductor body.

Published, European Patent Application EP 0 286 867 A describes a semiconductor pressure sensor configuration in which the semiconductor body is fixed to a ribbon cable and covered with a soft plastic synthetic material. The soft plastic synthetic material is placed inside a case with an opening so that the pressure is transferred to the semiconductor body over the soft plastic synthetic material. Here too, it is possible for the semiconductor body to incur damage because the soft plastic synthetic material does not always offer reliable protection against strong mechanical effects.

The technique is also known from Published, Non-Prosecuted German Patent Application DE 44 36 485 A, of accommodating silicon strain gages inside a case in a gel-based medium in a device for determining acceleration. The gel-based medium is relatively soft so that there is no certain guarantee that the silicon strain gages are protected against mechanical effects.

From "Habekotte E. et al., in: Elektronik 1/5.1.1990, p. 80–87" and "Kayal H. A., Rauch N. in: Elektronik 9/29.4.1988, p. 112–117" semiconductor sensor devices are known in which the sensor and the evaluation logic circuit are integrated together in the semiconductor body. As a result both manufacturing costs and the dimensions of the component are reduced.

From Published, Non-Prosecuted German Patent Application DE 41 33 061 an earlier type of pressure sensor is known in which a porous plate in the outer case is located around a measuring element. The outer case protects the measuring element from direct contact with liquids. The porous plate consists of PTFE and although it prevents the passage of liquid, it allows gases through which can attack the measuring element.

U.S. Pat. No. 5,436,491 shows another pressure sensor with an outer case. The case consists of steel or a similar material. It has an upwards facing open area which is closed with a diaphragm of metal. The semiconductor pressure unit is located inside the case on a base made of glass or a similar material.

A pressure sensor with a case consisting of a lower and an upper partial case is described in U.S. Pat. No. 4,914,954. The pressure sensor is located inside the combined case; the case is closed by a labyrinth.

Finally, a pressure sensor in an open case is known from Published, Non-Prosecuted German Patent Application DE 44 13 274 A. By using a membrane the case is covered extensively and closed. This configuration also does not always provide reliable protection of the pressure sensor against strong mechanical effects.

SUMMARY OF THE INVENTION

It is accordingly an object of the invention to provide a semiconductor sensor component which overcome the above-mentioned disadvantages of the prior art methods and devices of this general type, in which the semiconductor body is accessible for the medium to be measured but is at the same time reliably protected against damage even in the presence of strong mechanical effects.

With the foregoing and other objects in view there is provided, in accordance with the invention, a semiconductor sensor component, including:

a semiconductor body having both a sensor and an evaluation logic circuit formed in an integrated manner;

an encapsulating component formed by a molding process of an electrically insulating material enclosing at least partially the semiconductor body and providing the semiconductor body with mechanical protection, the encapsulating component, containing:

a main case body having edges for housing the semiconductor body;

a lid having a main lid body with edges and a through opening formed therein, the lid setting directly on the main case body such that the edges of the main lid body lying against the edges of the main case body; and a protective device disposed on the main lid body of the lid for closing the lid, the protective device being permeable to a medium to be sensed via the through opening, the protective device acting as a shield against mechanical stresses and having at least one of a membrane interrupting the through opening and a labyrinth having several winding passages leading to the through opening.

Thus in the invention the sensor and the evaluation electronics are integrated in one semiconductor body. The semiconductor body is not, however, provided in an inner case and additionally in an outer case. Instead, only one case is used whose lid with the membrane and/or the labyrinth is so configured that it is also able to withstand greater mechanical stresses.

For this purpose the lid can have as the membrane, for example, a metal foil which has through-openings in a lid main body made of a synthetic material and is thus exposed only in these through openings. Thus the metal foil here is not exposed over its entire area but, preferably, is for the most part extrusion-coated with the synthetic material so that in the case of a pressure sensor the pressure is transmitted only over the through openings onto the metal film acting as a membrane.

It is also possible to support the membrane at an edge of the lid main body formed of the synthetic material and having an opening, on its underside. In this way the membrane is protected over its entire area and is accessible solely via the opening in the lid main body.

The membrane can also be fixed to a ring-shaped projection within the edge of the lid main body with an opening. In this way it is possible to support the membrane "all-round" which as a result of its resulting advantageous intrinsic oscillation improves the response behavior of the semiconductor sensor configuration.

It is useful to provide the opening in the middle of the lid main body so that the medium to be measured is also applied to the middle of the membrane.

Instead of the membrane it is also possible to provide a labyrinth at the inner surface of the lid main body. If applicable a membrane and a labyrinth can also be used together.

The labyrinth can, for example, contain a spiral groove which leads from an outer opening located at the edge of the lid main body to an inner opening located in the middle of the lid main body and which is covered with a metal foil on the inside surface of the lid main body. With such a configuration the semiconductor body is protected extremely reliably against mechanical effects because there is no direct, straight-line access between the outer and the inner openings.

Advantageously it is possible to place a sealing medium, for example in the form of a drop of liquid, inside the labyrinth. A drop of oil can be used as the drop of liquid. In response to pressure changes the drop of liquid moves freely to and fro inside the meander-like labyrinth and thereby reliably seals the labyrinth between the outer and inner openings.

The labyrinth can also be formed through a spiral-shaped web which is embedded between the lid main body and a foil and which runs between an outer opening located at the edge of the lid main body and an inner opening located in the middle of the foil. A web of this sort can be fabricated in a simple way by an injection molding tool.

The cover can also consist of an injection molded part in which at least one through opening is provided such that a straight-line path into the inside of the case is prevented, i.e. such that this through opening also forms a "labyrinth".

Furthermore, it is possible to fabricate the lid from two synthetic material parts fitting into each other which are coupled together through a spring medium and which expose a through opening. This prevents straight-line access to the inside of the case, as soon as a certain pressure is applied to the spring medium. Here too the through opening is a "labyrinth" which prevents mechanical damage to the semiconductor body.

The semiconductor-sensor configuration according to the invention is simple to fabricate. The main bodies of the case and lid can be led on separate assembly lines to a work station and be combined there with each other. Also, the lid main body and, for example, a metal foil can be conveyed on separate assembly lines and combined together at the work station to form the lid.

Other features which are considered as characteristic for the invention are set forth in the appended claims.

Although the invention is illustrated and described herein as embodied in a semiconductor sensor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 10 is a fragmented, perspective view for explaining a fabrication process of the case;

FIG. 11 is a sectional view through the case according to a sixth exemplary embodiment;

FIG. 12 is a top plan view of the lid according to a seventh exemplary embodiment;

FIGS. 13 and 14 are sectional views through the lid of FIG. 12;

FIGS. 15 and 16 are sectional views through the lid according to an eighth exemplary embodiment; and FIG. 17 is a perspective view of the lid according to the eighth exemplary embodiment.

DESCRIPTION OF THE PREFERRED EMBODIMENTS

Figure 1:
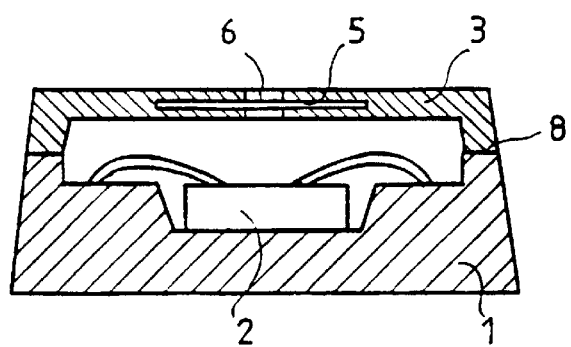
FIG. 1 is a diagrammatic, sectional view through a case for a semiconductor sensor configuration according to the invention.

In all the figures of the drawing, sub-features and integral parts that correspond to one another bear the same reference symbol in each case. Referring now to the figures of the drawing in detail and first, particularly, to FIG. 1 thereof, there is shown a case according to the invention for a semiconductor sensor configuration. The case consists of a case main body 1, a semiconductor body 2 attached thereto, and a lid 3 which closes the semiconductor body 2 inside the case main body 1. The semiconductor body 2 is bonded over connecting wires that are shown purely schematically in FIG. 1. An inside of the case must be accessible for a medium to be measured whereby, for example, the lid 3 can contain a membrane 5 that is exposed via a through opening 6 in order that in the case of a pressure sensor a pressure can exert an effect on the semiconductor body 2 via the membrane 5.

Figure 2:
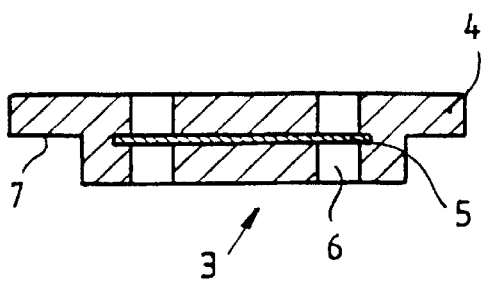
FIG. 2 is a sectional view through a lid according to a first exemplary embodiment.

FIG. 2 now shows a first concrete exemplary embodiment of the invention. Here the lid 3 contains a lid main body 4 formed of a synthetic material in which a metal foil of the membrane 5 is embedded which is injection molded into the synthetic material of the lid main body 4. Several of the through openings 6 are provided in the main lid body 4 so that the membrane 5 is exposed in the through openings 6 and can transmit the pressure into the inside of the case.

The lid shown in FIG. 2 is, for example, laid at its edge 7 on an edge 8 of the case main body 1 and glued together with this after the semiconductor body 2 has been bonded in a suitable way.

Figure 3:
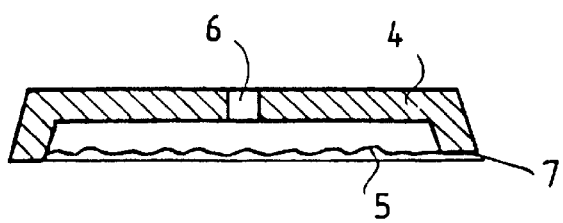
FIG. 3 is a sectional view through the lid according to a second exemplary embodiment.

FIG. 3 shows a second embodiment of the invention in which a film 5' of a synthetic material such as silicone, or a metal foil 5' is fixed to the raised edge 7 of the lid main body 4. The main lid body 4 formed of the synthetic material has here in its middle the through opening 6 so that the effect of a pressure exerted from the outside is applied to the membrane 5' at its middle, which favorably influences its response behavior.

Figure 4:
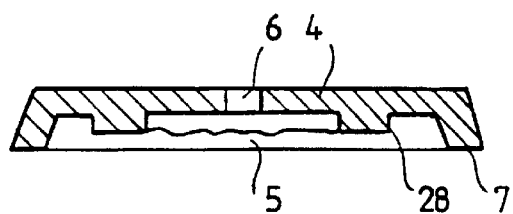
FIG. 4 is a sectional view of the lid according to a third exemplary embodiment.

FIG. 4 shows in a third exemplary embodiment of the invention a variant of the exemplary embodiment of FIG. 3. Here the membrane 5' is suspended at a circular prominence 28 on the underside of the lid main body 4 so that a square or rectangular suspension according to the exemplary embodiment of the invention of FIG. 3 can be modified into a round suspension, which is favorable for the response behavior of the membrane 5'.

Figure 5:
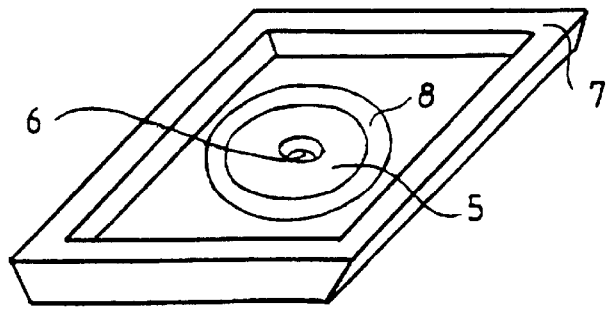
FIG. 5 is a perspective, partially cut-away view of the lid according to the third exemplary embodiment.

FIG. 5 shows the lid of FIG. 4 in perspective, whereby the round shape of the membrane 5' can be clearly recognized. The through opening 6 is shown in FIG. 5 for reasons of clarity, although it is actually covered by the membrane 5'.

In the exemplary embodiments of FIGS. 3 to 5 the membrane 5' is configured to be corrugated, which has proved useful for the transmission of pressure.

Figure 6:
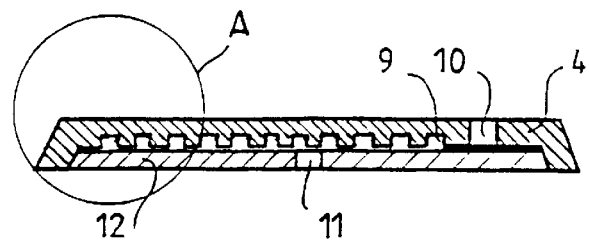
FIG. 6 is a sectional view through the lid according to a fourth exemplary embodiment.
Figure 7:
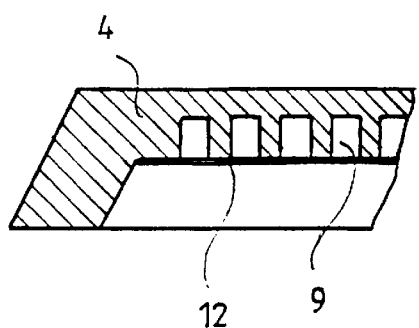
FIG. 7 is a sectional view of detail A of the lid shown in FIG. 6.
Figure 8:
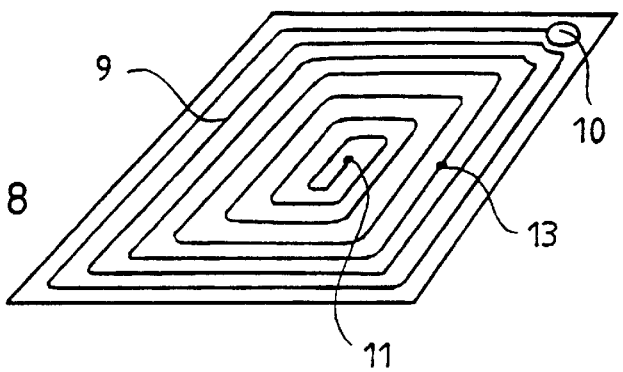
FIG. 8 is a perspective, bottom view of the lid shown in FIG. 6.

FIG. 6 shows a fourth exemplary embodiment of the invention in which a spiral-shaped labyrinth 9 has been worked into the main lid body 4, which labyrinth 9 leads from an outer opening 10 to an inner opening 11 as indicated schematically in FIG. 8. FIG. 7 shows a detail of the labyrinth 9 in the main lid body 4.

The labyrinth 9 can, for example, be incorporated in the main lid body 4 in that this is provided during casting with an appropriate groove and is then "sealed" with, for example, a metal foil or plastic film 12. For reasons of clarity the foil 12 is illustrated in FIG. 6 in an "exaggerated" way. The labyrinth 9 exerts a damping effect on the transmission of the pressure since a certain amount of time passes until a pressure change affecting the outer opening 10 reaches the inner opening 11 through the labyrinth 9.

As illustrated schematically in FIG. 8, a drop of a liquid 13, for example oil, can be placed in the labyrinth 9 in order to serve as a further seal between the outer opening 10 and the inner opening 11.

Figure 9:
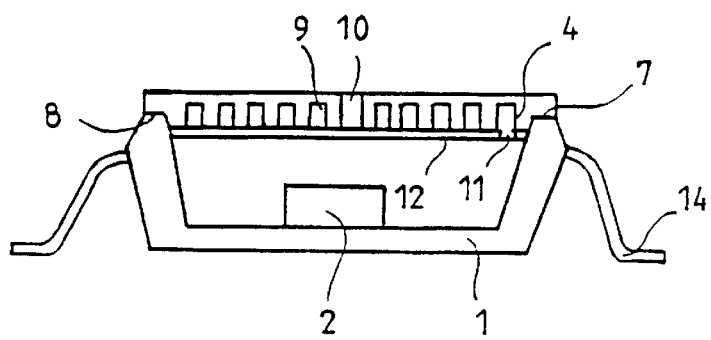
FIG. 9 is a sectional view through the case according to a fifth exemplary embodiment.

FIG. 9 shows a case according to a fifth exemplary embodiment of the invention in which the labyrinth 9 is provided in the main lid body 4, similarly to the fourth exemplary embodiment of FIGS. 6 to 8, and closed by an inner surface of the foil 12 or also of a thin copper part. The inner surface can be bonded to the main lid body 4 by an adhesive glue. At its edge 7, the main lid body 4 is glued to the edge 8 of the main case body 1. External electrical connections 14 are simply shown schematically in FIG. 9.

In contrast to the exemplary embodiment of FIGS. 6 to 8, the outer opening 10 in FIG. 9 is located in the middle of the main lid body 4 while the inner opening 11 is placed at the edge of the main lid body 4. Thus it is not absolutely necessary to provide the inner opening 10 in the middle of the main lid body 4, although this has proved to be useful in order to enable the pressure on the semiconductor body 2 to be exerted "in the middle".

FIG. 10 shows schematically how the case according to the invention can be fabricated via assembly line production. On a first assembly line 15 the main lid body 4 with the labyrinth 9 is delivered and is taken up by a non-illustrated suction tester. It can be useful to place the outer opening 10 not in the middle (as shown) in order that the suction tester can reliably take up the main lid body 4. The main lid body 4 is then glued to the foil 12 that is delivered on a second assembly line 16 and pulled from an underlay 17. The combination of the main lid body 4 with the foil 12 is indicated schematically through a bracket with an arrow 18. The main lid body 4 and the foil 12 glued to it are then glued by a tampon glue application to the outer edge 8 of a main case body 1, which is delivered on a third assembly line 19.

In this way the case according to the invention can be assembled simply by the use of three assembly lines.

FIG. 11 shows a sixth exemplary embodiment of the invention in which the main lid body 4 consists of a thin metal or synthetic material plate to which a spiral-shaped web 20 is glued which is in turn provided with the foil 12 of metal or a film 12 of synthetic material. The web 20 thereby forms the meander-shaped labyrinth 9 between the outer opening 10 and the inner opening 11. The web 20 can be advantageously fabricated as an injection molded part. As in the above exemplary embodiment, the drop of liquid 13 can also be placed in the labyrinth 9 to provide a seal.

FIGS. 12 to 14 show a seventh, particularly robust exemplary embodiment for the lid 3 of the case 1 according to the invention. Here the lid 3 includes an injection molded part which can be fabricated with three cores for a total of three outer openings 10 (see FIG. 12) and one core for the inner opening 11. As can be seen from FIGS. 13 and 14, there is no straight-line through path from the outer opening 10 to the inner opening 11 so that to this extent a labyrinth exists here as well. In this way a reliable protection of the semiconductor body 2 beneath the lid 3 is guaranteed.

Finally, FIGS. 15 to 17 show an eighth exemplary embodiment of the invention in which a "spring medium" 23 is provided between two lid halves 21 and 22 which engage one another by use of a nose, in which the spring medium 23 can be compressed under the influence of pressure. If pressure is exerted from the outside on the lid half 21, the spring medium 23 is compressed (see FIG. 16) whereby a through opening 24 is exposed. The two lid halves 21 and 22 consist of a synthetic material and can be fabricated by injection molding in a similar way to the main lid body 4 of the exemplary embodiments of FIGS. 12 to 14. Instead of the single through opening 24 shown in FIG. 17, it is possible to form, for example, three through openings.

The lid of the eighth exemplary embodiment makes possible a semiconductor pressure sensor that does not respond below a specific threshold value, namely until the spring medium 23 is compressed. For the spring medium 23 it is possible to use foam, a gas column or rubber.

The case according to the invention is, of course, not exclusively limited to use for a semiconductor sensor configuration in which the sensor and the evaluation logic circuit are integrated in one semiconductor body. It can also be used to advantage in a semiconductor sensor configuration in which the sensor and the evaluation logic circuit have different semiconductor bodies and are accommodated in a single shared case or in two separate cases. In the second variant only the sensor is provided with a case according to the invention.

We claim:

1. A semiconductor sensor component, comprising:
   a semiconductor body having both a sensor and an evaluation logic circuit formed in an integrated manner;
   an encapsulating component formed by a molding process of an electrically insulating material enclosing at least partially said semiconductor body and providing said semiconductor body with mechanical protection, said encapsulating component, including:
   a main case body having edges for housing said semiconductor body;
   a lid having a main lid body with edges and a through opening formed therein, said lid setting directly on said main case body such that said edges of said main lid body lying against said edges of said main case body; and
   a protective device disposed on said main lid body of said lid for closing said lid, said protective device being permeable to a medium to be sensed via said through opening, said protective device acting as a shield against mechanical stresses and having at least one of a membrane interrupting said through opening and a labyrinth having several winding passages leading to said through opening.

2. The semiconductor sensor component according to claim 1, wherein said main lid body has an under side and said membrane is supported on said underside of said main lid body facing towards said semiconductor body.

3. The semiconductor sensor component according to claim 1, wherein said main lid body is fabricated from a synthetic material and said membrane is embedded in said main lid body.

4. The semiconductor sensor component according to claim 1, wherein said membrane is supported immediately on said edges of said main lid body.

5. The semiconductor sensor component according to claim 1, including a ring-shaped projection formed in a central area of said main lid body and said membrane is supported by said ring-shaped projection.

6. The semiconductor sensor component according to claim 1, wherein said membrane is formed from a metal foil.

7. The semiconductor sensor component according to claim 1, wherein said main lid body has an outer opening formed therein disposed at one of said edges and said through opening is an inner opening formed at a middle region of said main lid body, said labyrinth having a spiral groove formed therein leading from said outer opening to said inner opening.

8. The semiconductor sensor component according to claim 1, wherein said main lid body has an inner surface and said labyrinth is disposed at said inner surface.

9. The semiconductor sensor component according to claim 7, including a metal foil covering said labyrinth.

10. The semiconductor sensor component according to claim 1, including a sealing medium in a form of a drop of a liquid disposed inside of said labyrinth.

11. The semiconductor sensor component according to claim 10, wherein said liquid is oil.

12. The semiconductor sensor component according to claim 9, wherein said labyrinth is a spiral-shaped web embedded between said main lid body and said metal foil and is led between said outer opening of said main lid body and said inner opening.

13. The semiconductor sensor component according to claim 7, wherein said lid is an injection molded part having at least one of said through opening formed therein and said at least one through opening is formed to prevent a straight-line passage into said encapsulating component.

14. The semiconductor sensor component according to claim 1, wherein said main lid body includes a spring medium and two synthetic-material parts engaging into each other and are coupled with each other over said spring medium, said two synthetic-material parts exposing said through opening if a specific pressure is applied to said spring medium, and said through opening preventing a straight-line passage into said encapsulating component.

15. A process for fabricating a semiconductor sensor component, which comprises:
   providing a semiconductor body having both a sensor and an evaluation logic circuit formed in an integrated manner; and
   molding an encapsulating component formed of an electrically insulating material for enclosing at least partially the semiconductor body and for providing the semiconductor body with mechanical protection, the encapsulating component, further comprises:
   forming a main case body having edges for housing the semiconductor body;
   forming a lid having a main lid body with edges and a through opening formed therein, the lid setting directly on the main case body such that the edges of the main lid body lie against the edges of the main case body;
   forming a protective device disposed on the main lid body of the lid for closing the lid, the protective device being permeable to a medium to be sensed via the through opening, the protective device acting as a shield against mechanical stresses and having at least one of a membrane interrupting the through opening and a labyrinth having several winding passages leading to the through opening;
   delivering the main case body on a first assembly line to a final work station; and
   delivering the lid on a second separate assembly line to the final work station where the main case body and the lid are combined with each other.

16. The process according to claim 15, which comprises:
   placing a sealing medium being a drop of oil inside of the labyrinth; delivering the main lid body on the first assembly line to an initial work station; and
   delivering a metal foil on a third separate assembly line to the initial work station where the main lid body and the metal foil are combined.

* * * * *